(12) United States Patent
Kim

(10) Patent No.: US 7,595,258 B2
(45) Date of Patent: Sep. 29, 2009

(54) OVERLAY VERNIER OF SEMICONDUCTOR DEVICE AND METHOD OF MANUFACTURING THE SAME

(75) Inventor: Jong Hoon Kim, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 225 days.

(21) Appl. No.: 11/753,544

(22) Filed: May 24, 2007

(65) Prior Publication Data

US 2008/0160261 A1    Jul. 3, 2008

(30) Foreign Application Priority Data

Dec. 28, 2006    (KR) .................. 10-2006-0136154

(51) Int. Cl.
*H01L 21/00* (2006.01)
(52) U.S. Cl. .............. 438/462; 438/401; 438/424
(58) Field of Classification Search ............ 438/462, 438/401, 424
See application file for complete search history.

(56) References Cited

U.S. PATENT DOCUMENTS

| | | | | |
|---|---|---|---|---|
| 5,935,764 | A * | 8/1999 | Kakehashi | 430/314 |
| 6,118,185 | A * | 9/2000 | Chen et al. | 257/797 |
| 6,207,966 | B1 * | 3/2001 | Nguyen et al. | 250/548 |
| 6,271,602 | B1 * | 8/2001 | Ackmann et al. | 257/797 |
| 6,391,745 | B1 * | 5/2002 | Kwon | 438/462 |
| 6,509,243 | B2 * | 1/2003 | Fan | 438/369 |
| 6,577,020 | B2 * | 6/2003 | Huang et al. | 257/797 |
| 6,624,039 | B1 * | 9/2003 | Abdelgadir et al. | 438/401 |
| 6,727,989 | B1 * | 4/2004 | Yin et al. | 365/400 |
| 6,767,680 | B2 * | 7/2004 | Schulz | 430/30 |
| 6,803,292 | B2 * | 10/2004 | Kim et al. | 438/401 |
| 6,809,420 | B1 * | 10/2004 | Wong | 257/773 |
| 6,958,281 | B2 * | 10/2005 | Kwon | 438/401 |
| 7,190,823 | B2 * | 3/2007 | Chen | 382/151 |
| 7,190,824 | B2 * | 3/2007 | Chen | 382/151 |
| 7,282,421 | B2 * | 10/2007 | Choi et al. | 438/401 |
| 7,316,963 | B2 * | 1/2008 | Lee | 438/401 |
| 7,473,619 | B2 * | 1/2009 | Cho et al. | 438/462 |
| 7,485,543 | B2 * | 2/2009 | Han et al. | 438/424 |
| 2002/0197812 | A1 * | 12/2002 | Fan | 438/369 |
| 2004/0017710 | A1 * | 1/2004 | Chang et al. | 365/201 |
| 2005/0118785 | A1 * | 6/2005 | Kwon | 438/427 |
| 2006/0035465 | A1 * | 2/2006 | Choi et al. | 438/692 |
| 2006/0131576 | A1 * | 6/2006 | Koh et al. | 257/48 |
| 2007/0020889 | A1 * | 1/2007 | Lee | 438/462 |

(Continued)

FOREIGN PATENT DOCUMENTS

KR    10-1998-0067819 A    10/1998

(Continued)

*Primary Examiner*—Laura M Menz
(74) *Attorney, Agent, or Firm*—Townsend and Townsend and Crew LLP

(57) ABSTRACT

After a mother vernier pattern is formed in a scribe region of a semiconductor substrate, a child vernier pad is formed on the inner region of a mother vernier, and a child vernier is formed on the child vernier pad in order to obviate the step of the mother vernier. Thus, at the time of an exposure process for forming the child vernier, failure of the pattern due to the step can be prevented and alignment can be measured accurately.

5 Claims, 3 Drawing Sheets

U.S. PATENT DOCUMENTS

| | | | |
|---|---|---|---|
| 2007/0063317 A1* | 3/2007 | Kim et al. | 257/622 |
| 2007/0155126 A1* | 7/2007 | Han et al. | 438/424 |
| 2007/0197038 A1* | 8/2007 | Kim et al. | 438/706 |
| 2007/0212650 A1* | 9/2007 | Sim | 430/313 |
| 2007/0292776 A1* | 12/2007 | Cho et al. | 430/22 |
| 2008/0160261 A1* | 7/2008 | Kim | 428/182 |
| 2009/0087962 A1* | 4/2009 | Cho et al. | 438/462 |

FOREIGN PATENT DOCUMENTS

| | | |
|---|---|---|
| KR | 1998-065652 | 10/1998 |
| KR | 1020010081504 A | 8/2001 |
| KR | 10-2005-0113822 A | 12/2005 |
| KR | 10-2006-0107653 A | 10/2006 |

* cited by examiner

OVERLAY VERNIER OF SEMICONDUCTOR DEVICE AND METHOD OF MANUFACTURING THE SAME

CROSS-REFERENCES TO RELATED APPLICATIONS

The present application claims priority to Korean patent application number 10-2006-0136154, filed on Dec. 28, 2006, which is incorporated by reference in its entirety.

BACKGROUND OF THE INVENTION

The present invention relates to an overlay vernier of a semiconductor device and, more particularly, to an overlay vernier and a method of manufacturing, in which errors in measured values due to the step can be decreased.

In general, a semiconductor manufacturing process includes implementing specific circuits on a wafer by using multiple layers including an insulating layer and a conductive layer. The most fundamental thing is to form specific patterns on the wafer. In particular, in the photo process using a light source and pattern, such as a mask or reticle, reliable semiconductor circuits can be implemented only when an alignment can be performed between a pattern formed in a pre-process and a pattern formed in a post process.

Generally, in the photo process, in order to confirm the degree of alignment between the pre- and post process patterns, a vernier is used. The vernier is formed around a chip of a semiconductor wafer, and is formed within scribe lines, which are cut and removed after the wafer process is completed.

The semiconductor manufacturing process includes multiple steps of pattern formation processes, and therefore employs a reticle in which a specific pattern is formed in each step. A vernier is formed in the reticle used in each step, a vernier formed in the pre-process becomes a reference key, and a vernier formed in the post process becomes a measurement key. Thus, the degree of overlay between the patterns is measured by checking the relative positional relationship between the vernier of the pre-process and the vernier of the post process.

The overlay vernier includes a box-in-box type vernier, a bar-in-bar type vernier, a modified bar-in-bar type vernier and so forth.

The overlay vernier comprises a mother vernier formed in the pre-process and a child vernier formed in a current process. In general, the mother vernier consists of a pattern having the same material as that of an actual cell pattern, and the child vernier consists of a photoresist pattern.

FIGS. 1 to 3 are cross-sectional views illustrating a conventional method of forming an overlay vernier.

Referring to FIG. 1, trenches are formed in the scribe regions of a semiconductor substrate 10 by means of an etch process, so that portions 11 projected from the peri region of the semiconductor substrate 10 are formed. The projected portions 11 are utilized as mother verniers. For reference, the mother verniers include patterns in rectangular form from a plan view.

Referring to FIG. 2, an insulating layer 12 is formed on the entire surface including the mother verniers 11. A polishing process is then performed to expose the top surface of the mother verniers 11.

Referring to FIG. 3, the insulating layer formed in the scribe region is removed by means of an etch process employing a key open mask. Exposure and development processes are then performed on the inner sides of the mother vernier 11 to form a child vernier 13.

However, at the time of the exposure and formation processes, the exposure process is not correctly performed due to the step of the mother vernier 11 and, therefore, the child vernier 13 does not have a square pattern of an accurate box-in-box type or a rectangular pattern of an accurate bar-in-bar type. Accordingly, fail may be caused at the time of a subsequent alignment measurement process, or misalignment may occur upon alignment of a subsequent process due to erroneous data although measurement is successful.

SUMMARY OF THE INVENTION

Accordingly, the present invention relates to an overlay vernier of a semiconductor device and a method of manufacturing the same, in which after a mother vernier pattern is formed in a scribe region of a semiconductor substrate, a child vernier pad is formed on the inner region of a mother vernier and a child vernier is formed on the child vernier pad in order to obviate the formation of the step of the mother vernier, so that at the time of an exposure process for forming the child vernier, failure of a pattern due to the step can be prevented and accurate alignment can be measured.

In an aspect, the present invention provides an overlay vernier of a semiconductor device, including a mother vernier having a square frame shape edge portions are projected, wherein the mother vernier has an internal space in a scribe region of a semiconductor substrate, a child vernier pad formed in the internal space of the mother vernier and having the same height as that of a top surface of the mother vernier, and a child vernier formed on the child vernier pad.

In another aspect, the present invention provides a method of forming an overlay vernier of a semiconductor device, including the steps of performing an etch process to form trenches in a scribe region of a semiconductor substrate, thus forming a mother vernier having an internal space and a square frame shape whose edge portions are projected, forming an insulating layer on the entire surface including the mother vernier, and then performing a polishing process to expose a top surface of the mother vernier, performing an etch process employing a key open mask so that the insulating layer remains only in one region of the internal space of the mother vernier, thus forming a child vernier pad, and coating a photoresist, and then performing exposure and development processes to form a child vernier on the child vernier pad.

DESCRIPTION OF SPECIFIC EMBODIMENTS

Specific embodiments according to the present patent will be described with reference to the accompanying drawings.

Figure 1:
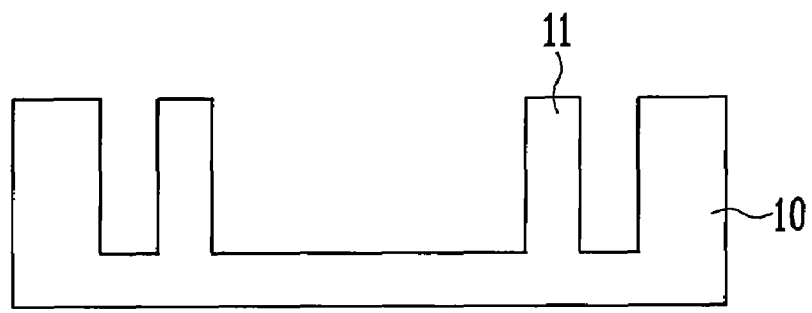
FIGS. 1 to 3 are cross-sectional views illustrating a conventional method of forming an overlay vernier.
Figure 2:
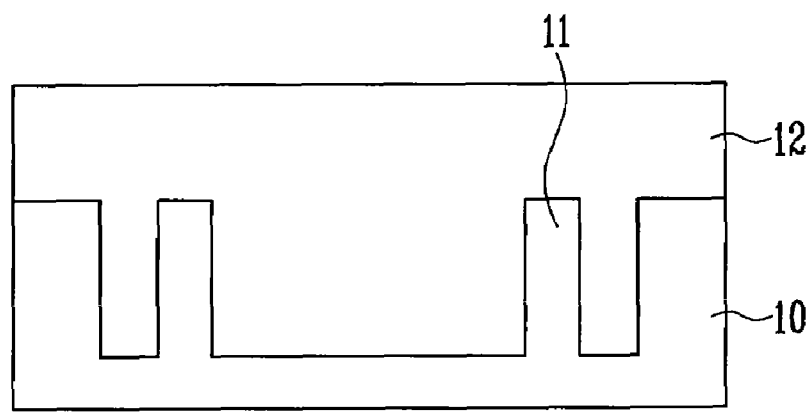
Figure 3:
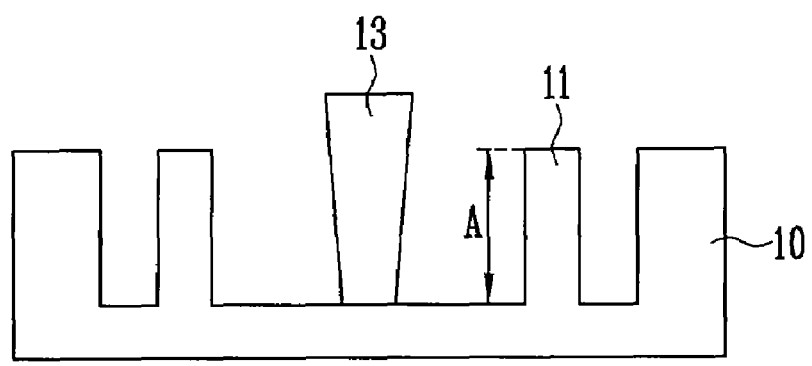
Figure 4A:
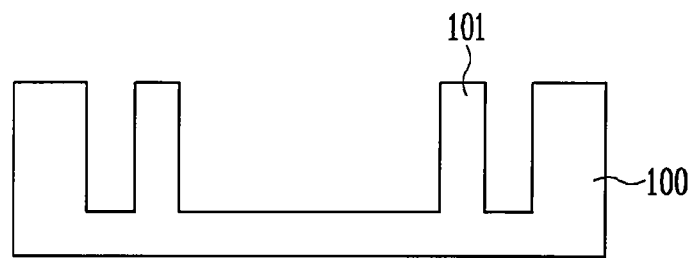
FIGS. 4 to 8 are cross-sectional views and plan views illustrating a method of forming an overlay vernier according to an embodiment of the present invention.
Figure 4B:
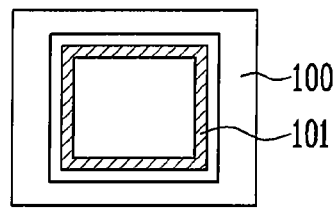

Referring to FIGS. 4A and 4B, a hard mask layer is formed on a semiconductor substrate 100. The hard mask layer is etched by means of exposure and etch processes, thus forming a hard mask pattern. The semiconductor substrate 100 is etched by means of an etch process using the hard mask pattern as an etch mask, thus forming trenches. The trench are formed not only on an isolation region (not illustrated) of a die in which elements are formed, but also in a scribe region as a specific pattern. Thus, projected mother verniers 101 are formed in the scribe region. The mother verniers 101 have an internal space and have a square frame shape from which edge portions are protruding.

Figure 5:
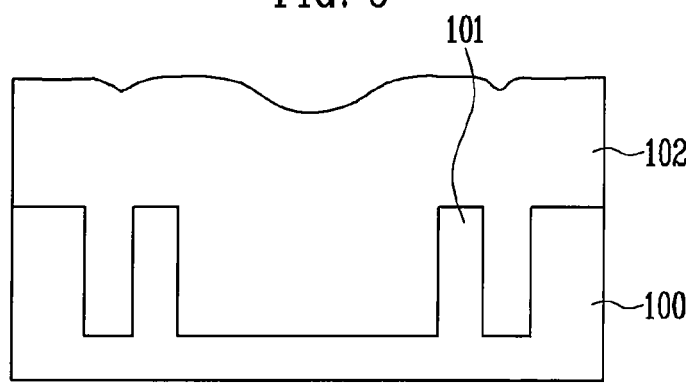

Referring to FIG. 5, an insulating layer 102 is formed on the entire surface including the mother verniers 101. The insulating layer 102 can be formed using an oxide layer.

Figure 6:
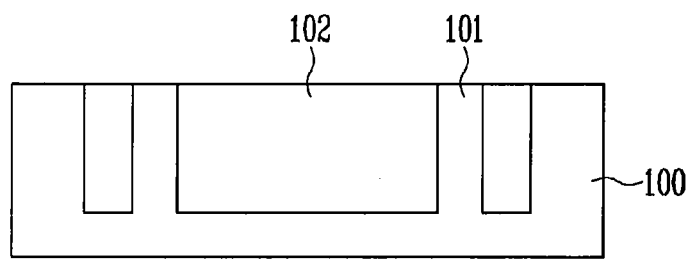

Referring to FIG. 6, a polishing process is performed to expose the top surface of the mother verniers 101. Therefore, the top surface of the insulating layer 102 has the same height as that of the mother verniers 101.

Figure 7:
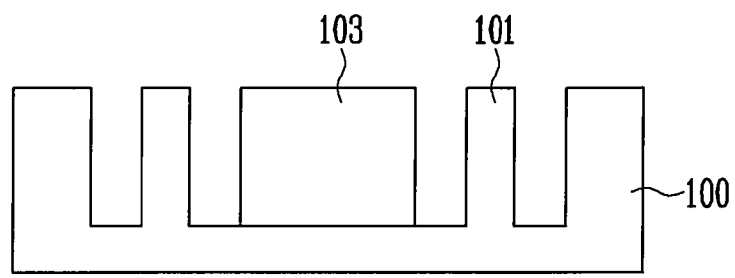

Referring to FIG. 7, the insulating layer is etched by using a key open mask for removing the insulating layer formed in the scribe region. At this time, the etch process employing the key open mask is not performed to remove all the insulating layer formed within the mother vernier 101, but is performed so that the insulating layer on a predetermined region, that is, a region in which a subsequent child vernier will be formed partially remains, thereby forming a child vernier pad 103.

The size of the child vernier pad 103 can be the same as or larger than that of a subsequent child vernier, but smaller than that of the mother vernier 101. In general, the size of the mother vernier 101 is twice the child vernier. Thus, the size of the child vernier pad 103 can be made 1 to 1.8 times larger than that of subsequent child vernier. The child vernier pad 103 can have a box or bar shape.

Figure 8A:
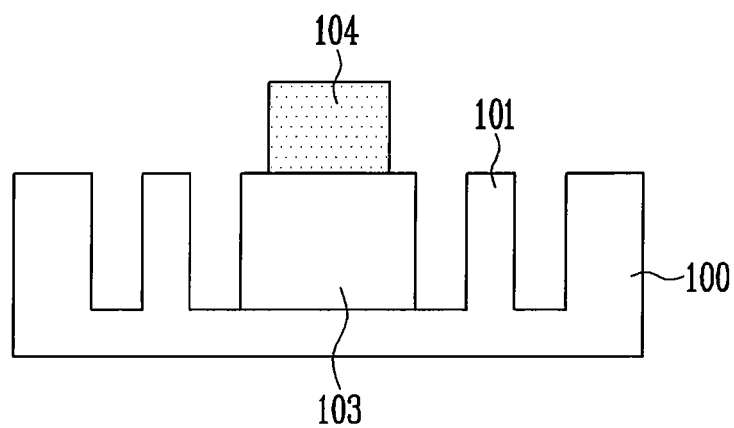
Figure 8B:
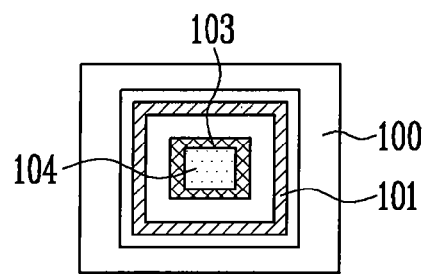

Referring to FIG. 8, photoresist material is coated on the entire surface including the child vernier pad 103. Exposure and development processes are then performed to form a child vernier 104 on the child vernier pad 103. At the time of the exposure process, a portion in which the child vernier 104 is formed does not have a step from the mother vernier 101, so that a normal pattern of the child vernier 104 can be formed.

The exposure process can be performed by using a light source of I rays (365 nm), KrF (248 nm), ArF (193 nm) or EUV (157 nm).

According to an embodiment of the present invention, after a mother vernier pattern is formed in a scribe region of a semiconductor substrate, a child vernier pad is formed on the inner region of a mother vernier, and a child vernier is formed on the child vernier pad in order to obviate the formation of the step of the mother vernier. Thus, at the time of an exposure process for forming the child vernier, failure of the pattern due to the step can be prevented and alignment can be measured accurately.

Although the foregoing description has been made with reference to the specific embodiment, it is to be understood that changes and modifications of the present patent may be made by the ordinary skilled in the art without departing from the spirit and scope of the present patent and appended claims.

What is claimed is:

1. A method of forming an overlay vernier of a semiconductor device, the method comprising:

performing an etch process to form trenches in a scribe region of a semiconductor substrate, thus forming a mother vernier having an internal space and a square frame shape whose edge portions are protruding upward;

forming an insulating layer on the entire surface including the mother vernier, and then performing a polishing process to expose a top surface of the mother vernier;

performing an etch process employing a key open mask so that the insulating layer remains only in one region of the internal space of the mother vernier, thus forming a child vernier pad; and coating a photoresist, and then performing exposure and development processes to form a child vernier on the child vernier pad.

2. The method of claim 1, wherein the insulating layer is formed of an oxide layer.

3. The method of claim 1, wherein the polishing process is performed so that a top height of the insulating layer is the same as that of the mother vernier.

4. The method of claim 1, wherein the child vernier pad has a size, which is smaller than that of the mother vernier, but larger than or the same as that of the child vernier.

5. The method of claim 1, wherein the exposure process is performed by using I rays (365 nm), KrF (248 nm), ArF (193 nm), EUV (157 nm), or a combination thereof.

* * * * *